United States Patent [19]

Riley

[11] 4,209,753
[45] Jun. 24, 1980

[54] AMPLIFIER PROGRAMMABLE IN GAIN AND OUTPUT POLARITY

[75] Inventor: John Riley, New York, N.Y.
[73] Assignee: Kepco, Inc., Flushing, N.Y.
[21] Appl. No.: 955,152
[22] Filed: Oct. 27, 1978
[51] Int. Cl.$^2$ .............................................. H03G 3/00
[52] U.S. Cl. ....................................... 330/51; 330/86; 330/110; 330/144; 330/282; 330/284
[58] Field of Search ................. 330/51, 86, 282, 284, 330/144, 145, 110

[56] References Cited

U.S. PATENT DOCUMENTS

| | | | |
|---|---|---|---|
| 3,970,868 | 7/1976 | Clements et al. | 307/252 |
| 4,016,557 | 4/1977 | Zitelli et al. | 330/86 X |
| 4,053,797 | 10/1977 | Tosuntikool et al. | 330/86 X |

OTHER PUBLICATIONS

Lasser, "Bipolar Autoranging for a DC Amplifier," *Nuclear Instruments and Methods*, vol. 126, No. 4, Jul. 1, 1975, pp. 579–581.

*Primary Examiner*—James B. Mullins
*Attorney, Agent, or Firm*—Alfred W. Barber

[57] ABSTRACT

A programmable amplifier includes an operational amplifier receiving an analog input signal of a given polarity and voltage range and a read only memory (ROM) control which actuates six switches in a resistor configuration connected to the amplifier in such a manner as to provide a selection of two gain factors and direct or inverted polarity output in response to combinations of digital signals on two input lines to the ROM.

5 Claims, 3 Drawing Figures

| INPUT | | | SWITCH CONDITION | | | | | | | OUTPUT | |
|---|---|---|---|---|---|---|---|---|---|---|---|
| $\overline{ATT}$ | $\overline{SGN}$ | | 16 | 17 | 18 | 19 | 20 | 21 | | POL. | GAIN |
| 0 | 0 | | OFF | OFF | ON | OFF | ON | OFF | | − | X 0.1 |
| 0 | 1 | | OFF | ON | OFF | OFF | OFF | ON | | + | X 0.1 |
| 1 | 0 | | OFF | OFF | ON | ON | OFF | OFF | | − | X 1.0 |
| 1 | 1 | | ON | OFF | OFF | OFF | OFF | ON | | + | X 1.0 |

AMPLIFIER PROGRAMMABLE IN GAIN AND OUTPUT POLARITY

BACKGROUND OF THE INVENTION

In automatic testing systems many applications require programmable sources of voltage or current as supplied by a programmable power supply. Such power supplies are generally responsive to analog control voltage which may be within a given range and of a predetermined polarity. For example, a power supply being programmed for a controlled output voltage may require an input voltage positive with respect to common and in the range of 0 to 10 volts while another power supply may be programmed for a controlled output current negative with respect to ground requiring a negative voltage with respect to common in the range from 0 to 1 volts. In either case digital voltage or current control signals have been converted to an analog voltage in the range of 0 to 10 volts and positive with respect to common. Thus, digitally controllable interface means is required to determine the range of voltage and polarity to be applied to the power supplies in response to the 0 to 10 positive voltage.

THE PRESENT INVENTION

The present invention comprises a controllable interface programmable amplifier adapted to receive an analog voltage of say 0 to 10 volts and positive with respect to common and to output an analog voltage either 0 to 10 volts i.e. multiplied by one or 0 to 1 volt i.e. multiplied by one-tenth and of a selectable polarity either positive or negative with respect to common. Six analog switches are connected to input and gain control resistors and an operational amplifier in such a manner that the gain and polarity of output of the operational amplifier can be determined by closing predetermined switch combinations. These switches are closed in predetermined combinations by digital signal from a ROM which in turn receives signals over two lines designated as attenuation (ATT) and sign (SGN). The ROM is programmed to closed the required switch combinations to achieve the predetermined conditions.

In the drawing

Figures 1, 2:
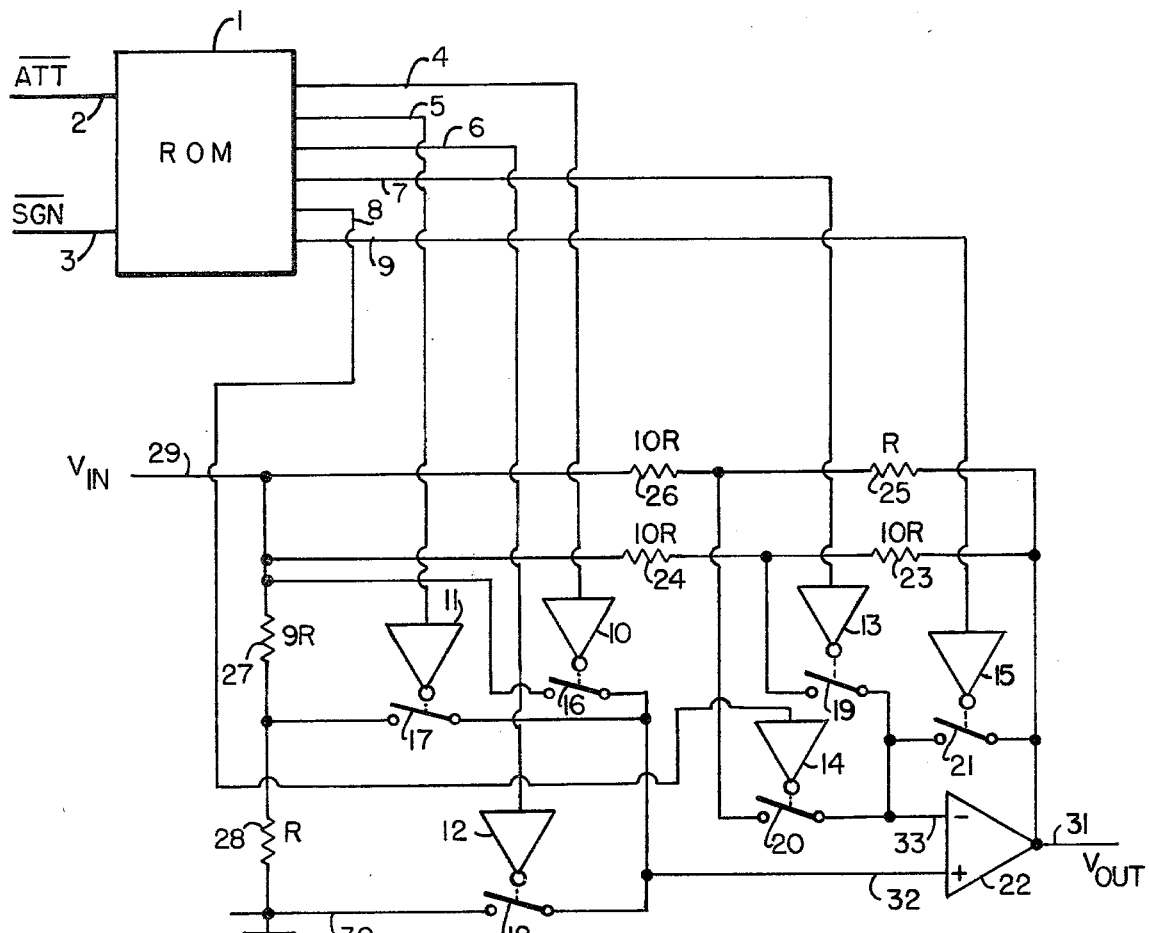
FIG. 1 is a block diagram of the ROM, resistors, switches and operational amplifier interconnected in accordance with the present invention.
FIG. 2 are the truth tables showing input signal conditions, switch conditions and resulting output conditions.

FIG. 1 shows a ROM 1 having two input lines 2 (ATT) and 3 (SGN) and six output lines 4, 5, 6, 7, 8 and 9 connected to switch drivers 10, 11, 12, 13, 14 and 15 respectively and controlling switches 16, 17, 18, 19, 20 and 21 respectively. Operational amplifier 22 and resistors 23, 24, 25, 26, 27 and 28 are interconnected by means of these switches to provide predetermined gain and polarity determination between an input line 29 and output line 31 with respect to common line 30.

Now referring to the truth tables of FIG. 2 in conjunction with block diagram FIG. 1 the various conditions will be set forth. When both ATT and SGN lines are at logic 0, switches 18 and 20 are closed and the others are open. Switch 18 connects the non-inverting input 32 of amplifier 22 to common line 30 and switch 20 connects inverting input 33 of amplifier 22 to the junction between feedback resistors 25 and 26. Resistors 25, 26, 27 and 28 are labeled R. 9R or 10R indicating their relative values. Thus, with an input on line 29 applied to one end of resistor 26 and a feedback ratio of R/10R the input on line 29 is divided by 10 so that the gain as shown in the output table is 0.1. Since the input is in effect to the inverting input of amplifier 22, the polarity (POL) of the output on line 31 is negative. To reiterate, O-O on input lines 2 and 3 provides a negative output multiplied by 0.1 with respect to the input analog signal on line 29.

To continue, a logic 0 on input line 2 and a logic 1 on input line 3 precessed in ROM 1 provides outputs on lines 5 and 9 closing switches 17 and 21. Switch 17 places the input from line 29 divided by 10 on noninverting input 32 and switch 21 connects output line 31 to inverting input 33 so that the input appears on output line 31 multiplied by 0.1 and of the same polarity (+).

Next, if logic 1 is applied to input line 2 and logic 0 to input line 3, the ROM program actuates switches 18 and 19. Switch 18 connects non-inverting input 32 to common line 30 and inverting input 33 to the junction between the two equal resistors 23 and 24. Resistor 23 is also connected to output line 31 acting as a feedback resistor and resistor 24 is connected to input line 29. Thus, with equal input and feedback resistors the gain from input line 29 to output line 31 is unity. The input being applied to the inverting input 33 causes the output on line 31 to be inverted. Thus, the output is negative at a gain of 1 with respect to the input analog signal on line 29.

Finally, the fourth possible condition is with both input lines 2 and 3 at logic 1 and programmed by ROM 1 closing switches 16 and 21. Switch 16 places the full input on line 29 on the non-inverting input 32 providing a non-inverted output on line 31 switch 21 connects output 31 to inverting input 33 for a gain of unity. Thus, the output is positive (+) at a multiplying factor of 1.

The analog switches described above are preferrably solid state switches such as the Siliconix type DG 201 or the equivalent.

Solid state switches have several differences when compared with mechanical switches. For example, they are much faster, take less power but have significant series resistance when closed. In order for this impedance be tolerated and not cause errors in the circuits of the present invention, the switches are placed, in all but one instance, in series with the input to the operational amplifier 22. Since the inputs to operational amplifier 22 are both high impedance, of the order of megohms, the switch impedances, of the order of a few hundred ohms at most, no errors are introduced by their use. In one case switch 21 connects output to input of operational amplifier 22 but without any other input connection, the amplifier will have unity gain even with a substantial feedback impedance.

The logic truth table of FIG. 2 shows the relationship between the logic states on the $\overline{\text{ATT}}$ and $\overline{\text{SGN}}$ input lines, the various switch conditions and the output polarity and gain as described in connection with FIG. 1 above. These relationships are provided by the predetermined gating set into the ROM.

Figure 3:
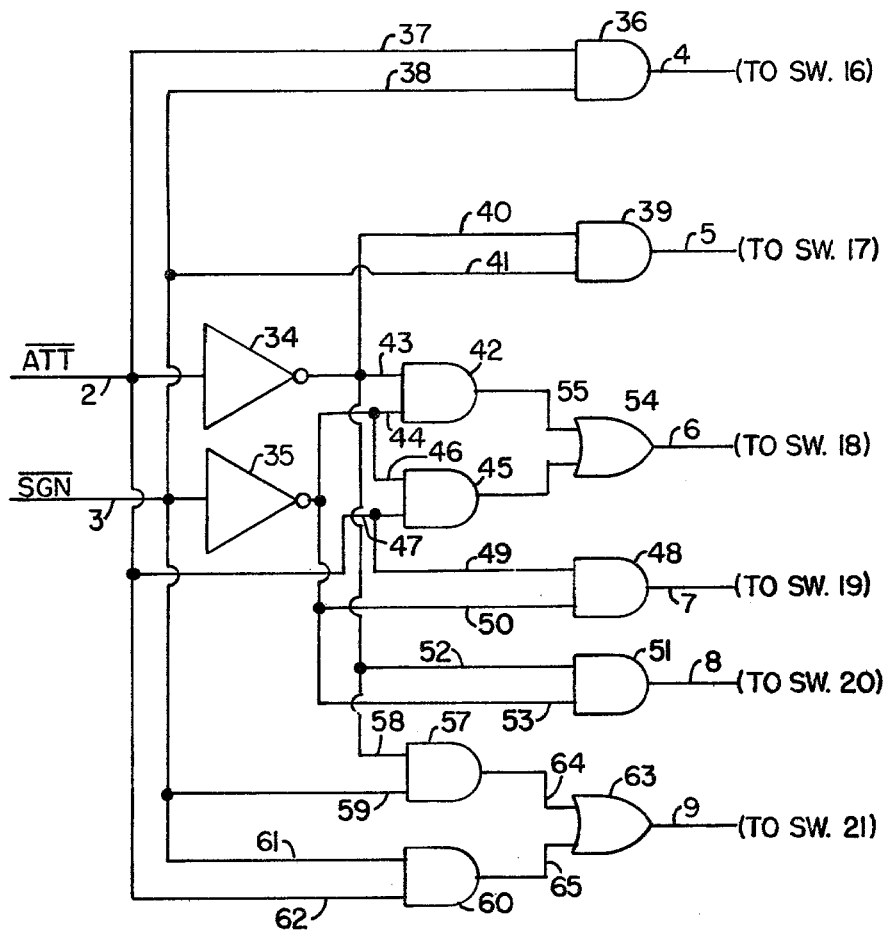
FIG. 3 is an example of how logic gates can be substituted for the ROM.

While the ROM is a very convenient and practical device for providing the logic switching called for in the present invention, such switching can also be provided by suitably interconnected inverters, AND gates and OR gates as shown in FIG. 3.

FIG. 3 will be shown to be equivalent to the ROM merely by showing how it functions in accordance with the truth table of FIG. 2. Taking the switches in order; line 4 to switch 16 is ON when both lines 37 and 38 to AND gate 36 are 1; line 5 to switch 17 is ON when line 40 as inverted by inverter 34 is 1 and line 41 is 1 turning on AND gate 39; line 6 to switch 18 is ON when lines 43 and 44 as inverted by inverters 34 and 35 turn on AND gate 42 and hence over line 55 to OR gate 54 making line 6 a 1 or when line 47 and line 46 inverted by inverter 35 are both ON causing AND gate 45 to place a 1 on line 55' and thus through OR gate 54 a 1 on line 6; line 7 to switch 19 is ON when line 49 is 1 and line 50 as inverted by inverter 35 is 1 turning on AND gate 48; line 8 to switch 20 is ON when lines 52 and 53 inverted by inverters 34 and 35 respectively are 1 turning on AND gate 51; and line 9 to switch 21 is ON when line 58 inverted by inverter 34 and line 59 are on turning on AND gate 57 placing a 1 on line 64 and through OR gate 63 to line 9 or when line 61 and line 62 are both ON causing and gate 60 to place a 1 on line 65 and through OR gate 63 to line 9.

While the preferred form of the present invention is shown in FIG. 1 and described above, modifications are possible within the spirit and scope of the invention as set forth, in particular, in the appended claims.

I claim:

1. In a programmable amplifier, the combination of;
an input line;
an output line;
an operational amplifier connected between said lines;
two input control lines;
a plurality of solid state switches for controlling the gain and polarity of said amplifier;
and a read only memory connected between said control lines and said switches for controlling said switches in accordance with a predetermined program in said read only memory and the states of said control lines.

2. In a programmable amplifier, the combination of;
an input line;
an output line;
an operational amplifier connected between said lines;
two input control lines;
a plurality of solid state switches for controlling the gain and polarity of said amplifier;
and a plurality of solid state gates connected between said control lines and said switches for controlling said switches in accordance with a predetermined logic program and the states of said control lines.

3. A programmable amplifier as set forth in claim 1, and;
wherein one of said two control lines controls the attenuation between said input line and said output line and the other of said two control lines controls the polarity of said output line with respect to said input line.

4. A programmable amplifier as set forth in claim 1, and;
wherein said switches are connected to said amplifier in circuits of substantial impedance whereby the accuracy of the attenuation ratio between said input line and said output line is insensitive to the closed circuit impedance of said switches.

5. In a programmable amplifier, the combination of;
an operational amplifier including an inverting input, a non-inverting input and an output;
a plurality of resistors of predetermined values for programming said amplifier to provide a gain of 1 or 0.1;
a plurality of solid state switches interconnecting said resistors and said amplifier inputs and output;
a pair of control lines, one for setting the gain of said amplifier and the other for determining the sign of the amplifier output with respect to its input;
an input line and an output line to said amplifier;
logic means for actuating said switches in accordance with a predetermined code relating the logic states of said control lines to the gain and polarity of said amplifier.

* * * * *